United States Patent [19]

Iwashita

[11] Patent Number: 5,029,138
[45] Date of Patent: Jul. 2, 1991

[54] SENSE AMPLIFIER CIRCUIT COUPLED TO A BIT LINE PAIR FOR INCREASING A DIFFERENCE IN VOLTAGE LEVEL AT AN IMPROVED SPEED

[75] Inventor: Shinichi Iwashita, Tokyo, Japan

[73] Assignee: NEC Corporation, Japan

[21] Appl. No.: 566,516

[22] Filed: Aug. 13, 1990

[30] Foreign Application Priority Data

Aug. 24, 1989 [JP] Japan .................................. 1-218193

[51] Int. Cl.[5] ............................................... G11C 7/02
[52] U.S. Cl. .................................... 365/208; 365/185; 365/190; 365/207; 365/210
[58] Field of Search ............... 365/190, 207, 208, 210, 365/185

[56] References Cited

U.S. PATENT DOCUMENTS

| | | | |
|---|---|---|---|
| 4,796,230 | 1/1989 | Young | 365/207 |
| 4,916,665 | 4/1990 | Atsumi et al. | 365/185 |
| 4,949,307 | 8/1990 | Campardo | 365/207 |
| 4,951,252 | 8/1990 | White et al. | 365/190 |
| 4,958,325 | 9/1990 | Nakagome et al. | 365/207 |

Primary Examiner—Joseph E. Clawson, Jr.
Attorney, Agent, or Firm—Laff, Whitesel, Conte & Saret

[57] ABSTRACT

A sense amplifier circuit is associated with at least one memory cell and comprises a series combination of a first p-channel type transistor and a second n-channel type transistor coupled between a source of positive voltage level and a first input node, a first negative feedback loop coupled between the first input node and the second n-channel type transistor, a series combination of a third p-channel type transistor and a fourth n-channel type transistor coupled between the source of positive voltage level and a second input node, a second negative feedback loop coupled between the second input node and the fourth n-channel type transistor, an output circuit coupled to the first and third n-channel type transistors in a current-mirror fashion and producing an output data signal, and first and second load elements respectively coupled between the first and second input nodes and a ground node, wherein each of the first and second load elements is smaller in conductance than the memory cell and restricts the associated input node to excessively fluctuate upon a change of memory cell to be accessed.

6 Claims, 5 Drawing Sheets

SENSE AMPLIFIER CIRCUIT COUPLED TO A BIT LINE PAIR FOR INCREASING A DIFFERENCE IN VOLTAGE LEVEL AT AN IMPROVED SPEED

FIELD OF THE INVENTION

This invention relates to a semiconductor memory device and, more particularly, to a sense amplifier circuit incorporated in the semiconductor memory device.

DESCRIPTION OF THE RELATED ART

A typical example of the sense amplifier circuit incorporated in a semiconductor memory device is disclosed in Japanese Patent Application No. 63-158742. FIG. 1 shows the arrangement of the semiconductor memory device disclosed therein and comprises a memory cell array 1 consisting of non-volatile memory cells M1, M2, M3 and M4 each memorizing a bit of data information represented by a true data bit combined with a complementary data bit thereof. Therefore, the non-volatile memory cells M1, M2, M3 and M4 respectively have memory transistors M00, M01, M10 and M11 paired with memory transistors CM00, CM01, CM10, respectively. The true data bits are respectively assigned the memory transistors M00 to M11, and the complementary data bits are supplied to the memory transistors CM00 to CM11, respectively. The memory transistors M00 to M11 and CM00 to CM11 are of the FAMOS (Floating Gate Avalanche Metal Oxide Semiconductor) structure; however, the memory cell array 1 may be fabricated by using MASK PROM (Mask Programmable Read Only Memory) transistors in a similar arrangement.

The memory cell array 1 is associated with word lines W0 and W1, and the memory transistors M00 to M11 and CM00 to CM11 are coupled at the floating gates thereof to the associated word lines W0 and W1, respectively. When a row address signal is supplied to a row address decider circuit 2, one of the word lines W0 to W1 is shifted to an active level, and the memory transistors M00 to M11 and CM00 to CM11 selectively turn on depending upon the true and complementary data bits stored therein. Namely, if the memory transistors M00 to M11 and CM00 to CM11 are selectively written with an extremely high write-in voltage level, avalanche breakdown phenomena take place in the selected memory transistors M00 to M11 and CM00 to CM11, and electrons are injected into the respective floating gates. This results in that the threshold voltage levels of the selected memory transistors M00 to M11 and CM00 to CM11 are shifted to about 10 volts, and, for this reason, the selected memory transistors M00 to M11 and CM00 to CM11 hardly turn on even if the associated word line is activated. The memory transistors CM00, CM01, M10 and M11 are assumed to be written with the extremely high write-in voltage level in the following description, but the other memory transistors M00, M01, CM10 and M11 have a threshold voltage level low enough to turn on with the activated word lines W0 and W1.

The memory cell array 1 is further associated with bit line pair BP0 and BP0 consisting of bit lines BL0 an BL1 and the complementary bit lines CBL0 and CBL1. The memory transistors M00 to M11 and CM00 to CM11 are coupled at the drain nodes to the associated bit lines and the complementary bit lines, respectively, and are grounded at the other source nodes thereof. The bit line pairs BP0 and BP1 are coupled to a column selector circuit 3, and the column selector circuit 3 is transparent to one of the bit line pairs BP0 and BP1 depending upon a selecting signal. The column selector circuit 3 is further coupled to a sense amplifier circuit 4, and the sense amplifier circuit 4 supplies an output data bit to an output circuit (not shown).

The circuit arrangement of the sense amplifier circuit 4 is illustrated in FIG. 2 and comprises two amplifier stages 4a and 4b coupled to the column selector circuit 3. The amplifier stages 4a and 4b are associated with an output stage, and the output stage is coupled to the output circuit. The amplifier stage 4a has a series combination of a p-channel type field effect transistor QP1 and an n-channel type filed effect transistor QN1 and an inverter circuit IN1 coupled between the column selector circuit 3 and the gate electrode of the n-channel type field effect transistor QN1 Similarly, the amplifier stage 4b has a series combination of a p-channel type field effect transistor QP2 and an n-channel type field effect transistor QN2 and an inverter circuit IN2 coupled between the column selector circuit 3 and the gate electrode of the n-channel type field effect transistor QN2. The output stage has a series combination 4c of a p-channel type field effect transistor QP3 and an n-channel type field effect transistor QN3 associated with the amplifier stage 4a and a series combination 4d of a p-channel type field effect transistor QP4 and an n-channel type field effect transistor QN4 associated with the amplifier stage 4b.

Description is made on the circuit behavior of the sense amplifier circuit shown in FIG. 2 with reference to FIG. 3. When a data read-out from the memory cell M1 is completed, the address signals are assumed to request an access to the memory cell M3. While the data read-out is carried out from the memory cell M1, the memory transistor M00 is turned on in the presence of the activated word line W0, but the memory transistor CM00 remains off. The column selector circuit 3 interconnects the sense amplifier circuit 4 and the bit line pair BP0 and propagates the ground voltage level to the input node of the inverter circuit IN1 and the n-channel type field effect transistor QN1. Since the inverter circuit IN1 supplies a positive high voltage level to the gate electrode of the n-channel type field effect transistor QN1, the n-channel type field effect transistor QN1 turns on and a current path is established from the source of positive voltage level Vdd through the p-channel type field effect transistor QP1, the n-channel type field effect transistor QN1, the column selector circuit 3 and the memory transistor M00 to the ground node. The inverter circuit IN1 and the n-channel type field effect transistor QN1 form in combination a negative feedback loop, and the negative feedback loop regulates a voltage level at a node Sin (see FIG. 2). The threshold voltage level of the inverter circuit IN1 is taken into account, and the voltage level at the node Sin is regulated to about 1.2 volt. The drain node of the memory transistor M00 is assumed to be as low as the node Sin, the amount of current passing through the memory transistor M00 is about 100 micro-ampere. On the other hand, the memory transistor CM00 in the off-state causes the inverter circuit IN2 to cut off the current path in the n-channel type field effect transistor QN2, and the voltage level at a node CSin is higher than that of the node Sin. The higher voltage level at the node CSin causes the p-channel type field effect transistor QP2 and, accordingly, the transistor QP4 to turn off.

This results in that the n-channel type field effect transistors QN4 and QN3 turn off. The current passing through the p-channel type field effect transistor QP1 decreases the drain node thereof and, accordingly, the gate electrode of the p-channel type field effect transistor QP3 in voltage level and allows the p-channel type field effect transistor QP3 to turn on. Then, the voltage level at an output node Sout goes up to a positive high voltage level slightly lower than the positive high voltage level Vdd.

When the address signals request the access to the memory cell M3, the row address decoder circuit 2 allows the word line W0 to go down to a inactive low voltage level and activates the word line W1 at time t2. The selecting signal causes the column selector circuit 3 to interconnect the sense amplifier circuit 4 and the bit line pair BP1. The activated word line W1 causes the memory transistor CM10 to turn on, but the memory transistor M10 never turns on because of the electron injection previously carried out. For this reason, the node CSin is coupled through the memory transistor CM10 to the ground node, but the node Sin is blocked from the ground node. Then, the nodes Sin and CSin are complementarily varied as indicated by real lines Sin and CSin (time t2). When the node CSin is decreased in voltage level due to the memory transistor CM10, the inverter circuit IN2 allows the n-channel type field effect transistor to turn on, and the p-channel type field effect transistors QP2 and QP4 also turn on to provided current paths from the source of positive voltage level Vdd to the n-channel type field effect transistors QN2 and QN4, respectively. With the positive voltage level, the n-channel type filed effect transistors QN4 and QN3 turn on, but the memory transistor M10 in the off-state results in the n-channel type field effect transistor QN1 in the off-state which further results in the p-channel type field effect transistors QP1 and QP3 in the off-states. Then, the voltage level at the output node Sout delays toward the ground voltage level as indicated by real line Sout.

As described hereinbefore, either node Sin or CSin coupled to the memory transistor in the on-state is about 1.2 volt, and the other node coupled to the memory transistor in the off-state is as high as a certain voltage level where either inverter circuit IN1 or IN2 allows the associated n-channel type field effect transistor QN1 or QN2 to turn off. The inverter circuits IN1 or IN2 causes the n-channel type field effect transistor QN1 or QN2 to turn off at about a certain voltage level, i.e. 50 millivolt higher than the other node CSin or Sin, respectively. However, each of the inverter circuits IN1 and IN2 introduces a time delay in the associated feedback loops, and the bit line or the complementary bit line tends to exceed the certain voltage level when the inverter IN1 or IN2 cuts off the n-channel type field effect transistor QN1 or QN2. In this circumstance, if the bit line is, then, coupled to a memory transistor in the on-state, the charges accumulated in the bit line or the complementary bit line is discharged through the memory transistor in the on-state. As described hereinbefore, the only 100 micro-ampere flows through the memory transistor, and the excess voltage level on the bit line or the complementary bit line causes the sense amplifier 4 to consume a relatively long time period.

Assuming now that the bit line has a parasitic capacitance C of 30 pF and that the bit line coupled to a memory transistor in the off-state is higher than the complementary bit line coupled to a memory transistor in the onstate by an excess voltage dV of 30 millivolt, a time delay dT introduced in the feedback loop is calculated as $$i = dQ/dT = 100 \qquad \text{(Equation 1)}$$

where i is the amount of current flowing through the memory transistor in the on-state, and dQ is the amount of electric charges to be discharged at 1.2 volt. The amount of current is estimated at 100 micro-ampere when the drain node of the memory transistor is about 1.2 volt.

$$dQ = C \times dV \qquad \text{(Equation 2)}$$

From Equations 1 and 2, we obtain $$\begin{aligned} dT &= dQ/i \\ &= (30 \times 30)/100 \\ &= 9 \text{ micro-second} \end{aligned}$$

The time delay dT of 9 micro-second is not negligible, but is inherent to the prior art semiconductor memory device.

SUMMARY OF THE INVENTION

It is therefore an important object of the present invention to provide a sense amplifier circuit which operates at an improved speed.

To accomplish the object, the present invention proposes to couple first and second load means to a pair of input nodes, respectively. The first and second load means discharges excess current upon change of a memory cell to be accessed, and, for this reason, the sense amplifier circuit carries out the amplification at an improved speed.

In accordance with the present invention, there is provided a sense amplifier circuit associated with at least one memory cell, comprising: a) a pair of input nodes respectively coupled to a signal line and a complementary signal line, the signal line and the complementary signal line being varied in voltage level in a complementary manner depending upon a bit of data information memorized in the memory cell; b) a series combination of a first transistor of one channel conductivity type and a second transistor of the opposite channel conductivity type coupled between a first source of voltage level and one of the input nodes; c) a first negative feedback loop coupled between aforesaid one of the input nodes and the second transistor; d) a series combination of a third transistor of aforesaid one channel conductivity type and a fourth transistor of the opposite channel conductivity type coupled between the first source of voltage level and the other input node; e) a second negative feedback loop coupled between the other input node and the fourth transistor; f) an output circuit coupled to the first and third transistors in a current-mirror fashion and producing an output data signal; and g) first and second load means respectively coupled between the input nodes and a second source of voltage level different in voltage level from the first source of voltage level, each of the first and second load means being smaller in conductance than the memory cell.

BRIEF DESCRIPTION OF THE DRAWINGS

The features and advantages of a sense amplifier circuit according to the present invention will be more clearly understood from the following description taken in conjunction with the accompanying drawings in which.

DESCRIPTION OF THE PREFERRED EMBODIMENTS

First Embodiment

Figure 4:
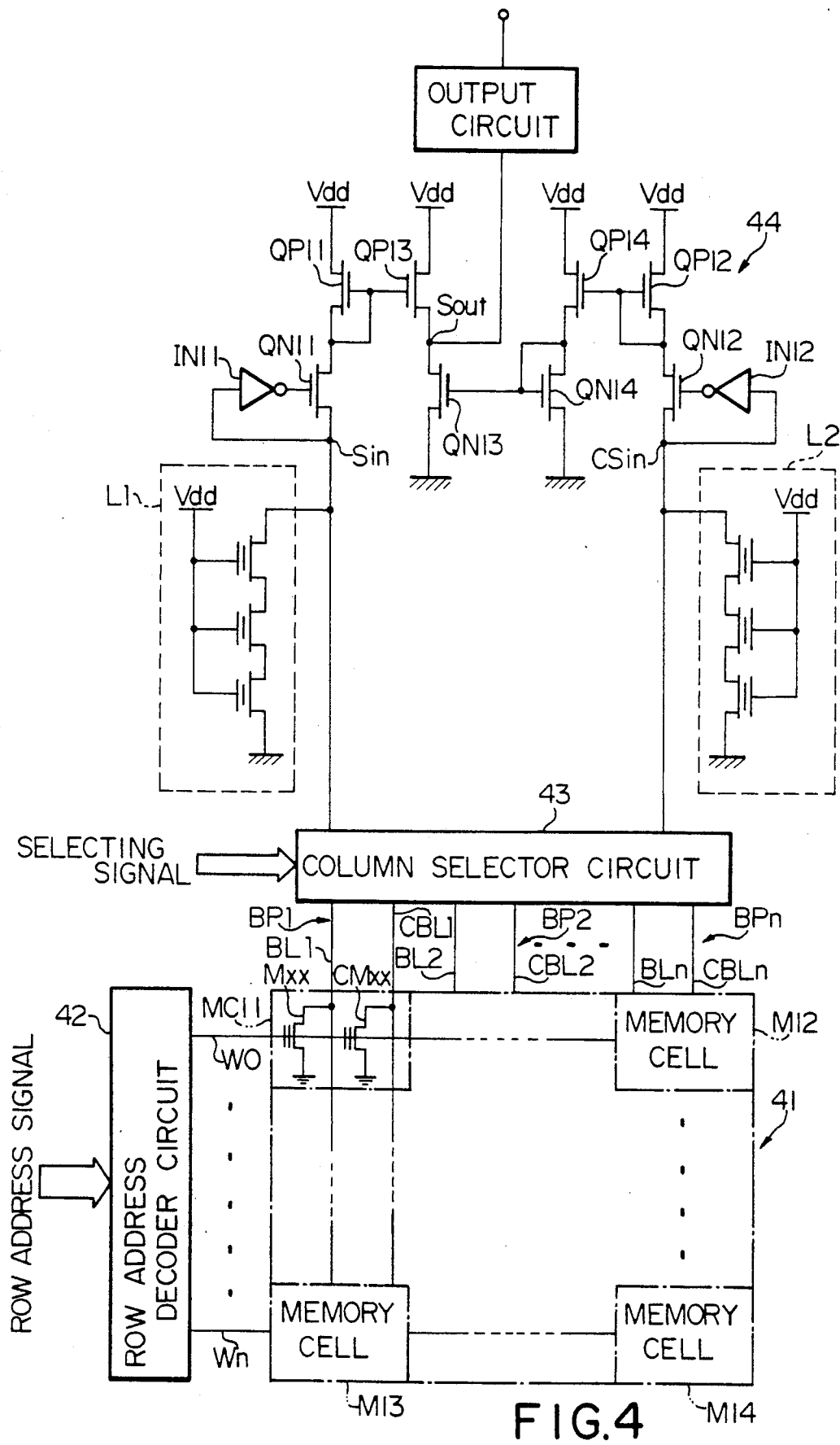
FIG. 4 is a circuit diagram showing the arrangement of a semiconductor memory device in which a sense amplifier circuit according to the present invention is incorporated.

Referring to FIG. 4 of the drawings, a semiconductor memory device comprises a memory cell array 41 having a plurality of non-volatile memory cells MC11, MC12, MC13 and MC14 each memorizing a bit of data information represented by a true data bit combined with a complementary data bit thereof. Therefore, each of the non-volatile memory cells MC11, MC12, MC13 and MC14 has a memory transistor Mxx paired with a memory transistor CMxx. The true data bits are respectively assigned the memory transistors Mxx, and the complementary data bits are supplied to the memory transistors CMxx, respectively. The memory transistors Mxx and CMxx are of the FAMOS structure; however, the memory cell array 41 may be fabricated by using MASK PRO transistors in a similar arrangement.

The memory cell array 41 is associated with word lines W0 and Wn, and the memory transistors Mxx to CMxx in each row are coupled at the floating gates thereof to the associated word line W0, ... or Wn. When a row address signal is supplied to a row address decider circuit 42, one of the word lines W0 to Wn is shifted to an active level, and the memory transistors Mxx and CMxx selectively turn on depending upon the true and complementary data bits stored therein. Namely, if the memory transistors Mxx to CMxx are selectively written with an extremely high write-in voltage level, avalanche breakdown phenomena take place in the selected memory transistors Mxx and CMxx, and electrons are injected into the respective floating gates. This results in that the threshold voltage levels of the selected memory transistors Mxx and CMxx are shifted to about 10 volts and, for this reason, the selected memory transistors Mxx and CMxx hardly turn on even if the associated word line is activated.

The memory cell array 41 is further associated with bit line pair BP1, BP2 and BPn consisting of bit lines BL1, BL2 and BLn and the complementary bit lines CBL1, CBL2 and CBLn. The memory transistors Mxx are coupled between the associated bit lines and a ground node, and the memory transistors CMxx are coupled between the associated complementary bit lines and the ground node. The bit line pairs BP1, BP2 and BPn are coupled to a column selector circuit 43, and the column selector circuit 43 is transparent to one of the bit line pairs BP1 to BPn depending upon a selecting signal. The column selector circuit 43 is further coupled to a sense amplifier circuit 44, and the sense amplifier circuit 44 supplies an output data bit from an output node thereof Sout to an output circuit (not shown). The circuit arrangement of the sense amplifier circuit 44 comprises a series combination of a first p-channel type field effect transistor QP11 and a second n-channel type field effect transistor QN11 coupled between a source of a positive voltage level Vdd and a first input node Sin, a first negative feedback loop coupled between the first input node Sin and a gate electrode of the second n-channel type field effect transistor QN11, a series combination of a third p-channel type field effect transistor QP12 and a fourth n-channel type field effect transistor QN12 coupled between the source of positive voltage level Vdd and a second input node CSin, a second negative feedback loop coupled between the second input node CSin and a gate electrode of the fourth n-channel type field effect transistor QN12, an output circuit coupled to said first and third p-channel type field effect transistors QP11 and QP12 in a current-mirror fashion, and first and second load means L1 and L2 respectively coupled between the first and second input nodes Sin and CSin and the ground node. In this instance, the first and second negative feedback loops are implemented by inverter circuits IN11 and IN12, and the output circuit comprises a series combination of a fifth p-channel type field effect transistor QP13, the output node Sout and a sixth n-channel type field effect transistor QN13 coupled between the source of positive voltage level Vdd and the ground node, and a series combination of a seventh p-channel type field effect transistor QP14 and an eighth n-channel type field effect transistor coupled between the source of positive voltage level Vdd and the ground node. A gate electrode of the fifth p-channel type field effect transistor QP11 is coupled to a gate electrode of the first p-channel type field effect transistor QP11, and a gate electrode of the seventh p-channel type field effect transistor QP14 is coupled to a gate electrode of the third p-channel type field effect transistor QP12. Thus, the first and third p-channel type field effect transistors QP11 and QP12 are coupled to the fifth and seventh p-channel type field effect transistors Qp13 and QP14 in a current-mirror fashion, and the switching actions of the first and third p-channel type field effect transistors QP11 and QP12 are relayed to the fifth and seventh p-channel type field effect transistors QP13 and QP14, respectively.

Each of the first and second load means L1 and L2 is implemented by a series of load transistors of the FAMOS configuration, and the number of the load transistors is determined in such a manner that each of the first and second load means L1 and L2 is smaller in conductance than the single memory cell Mxx or CMxx.

Figure 1:
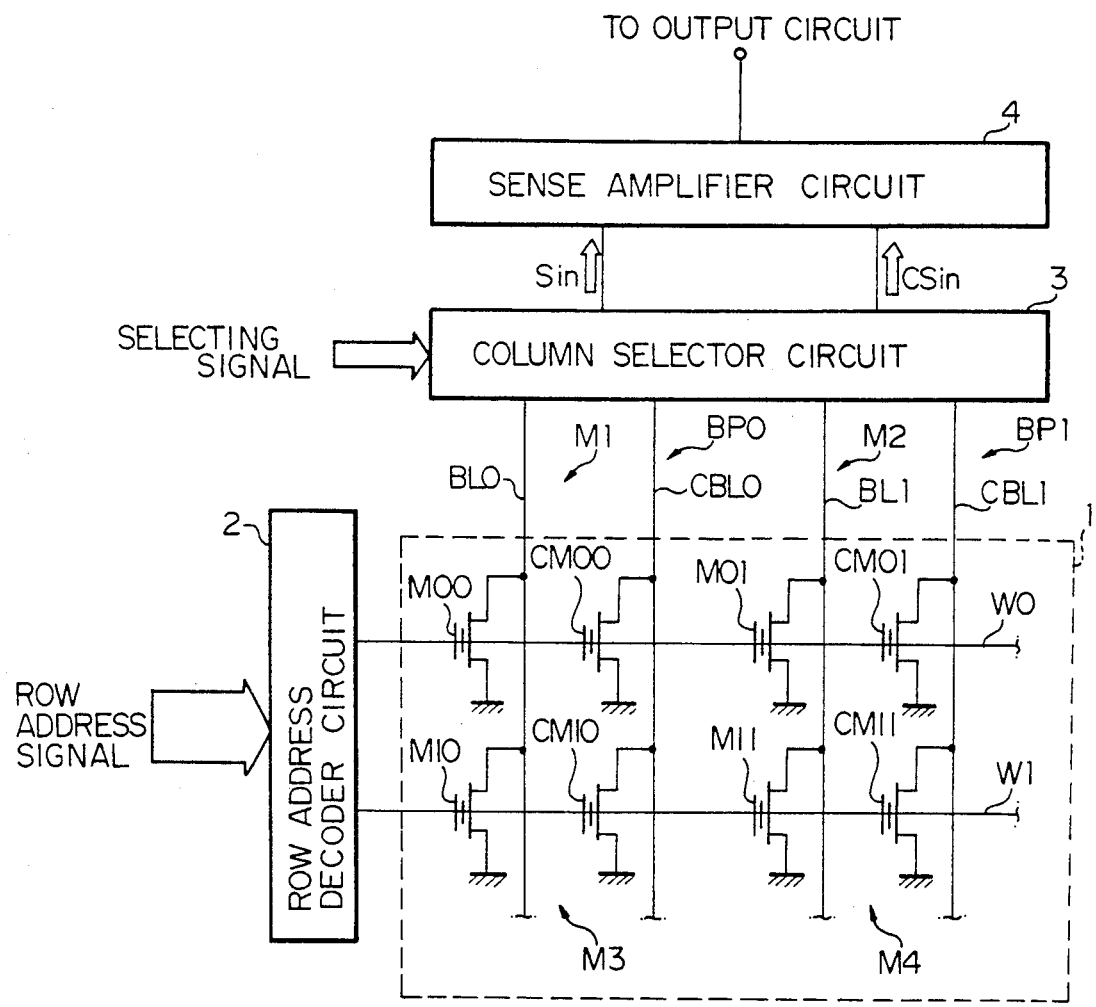
FIG. 1 is a circuit diagram showing the arrangement of a prior art semiconductor memory device disclosed in Japanese Patent Application No. 63-158742.
Figure 2:
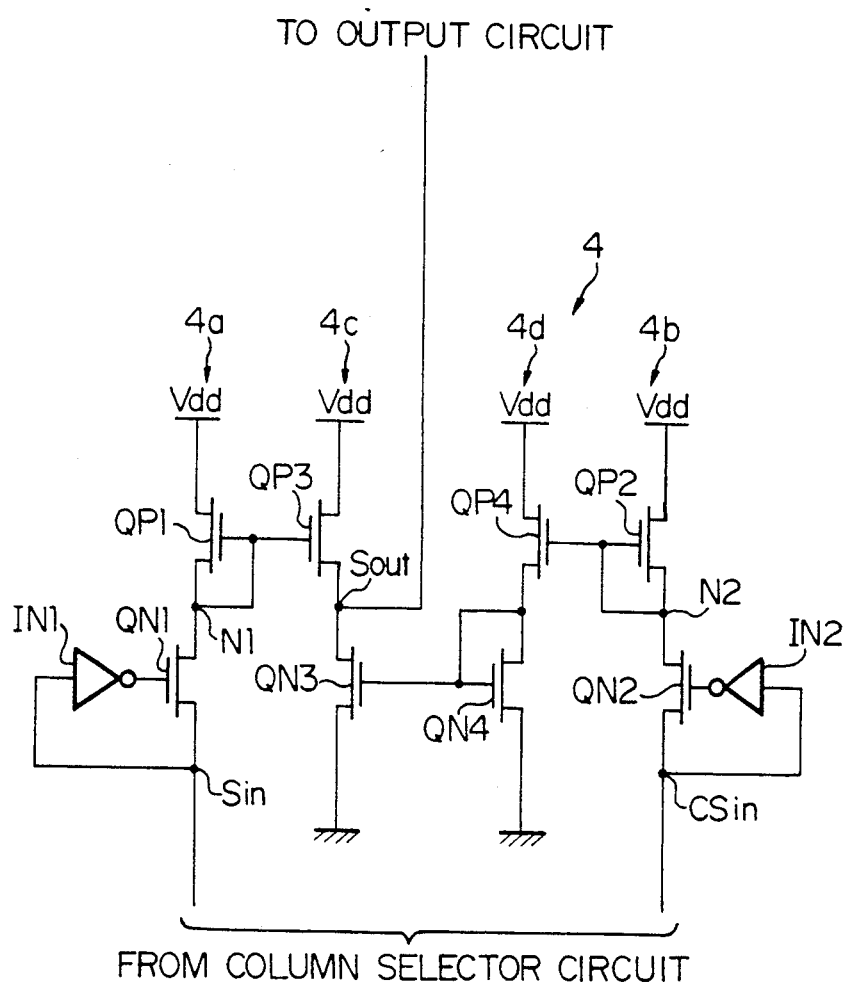
FIG. 2 is a circuit diagram showing the arrangement of a sense amplifier circuit incorporated in the prior art semiconductor memory device.
Figure 3:
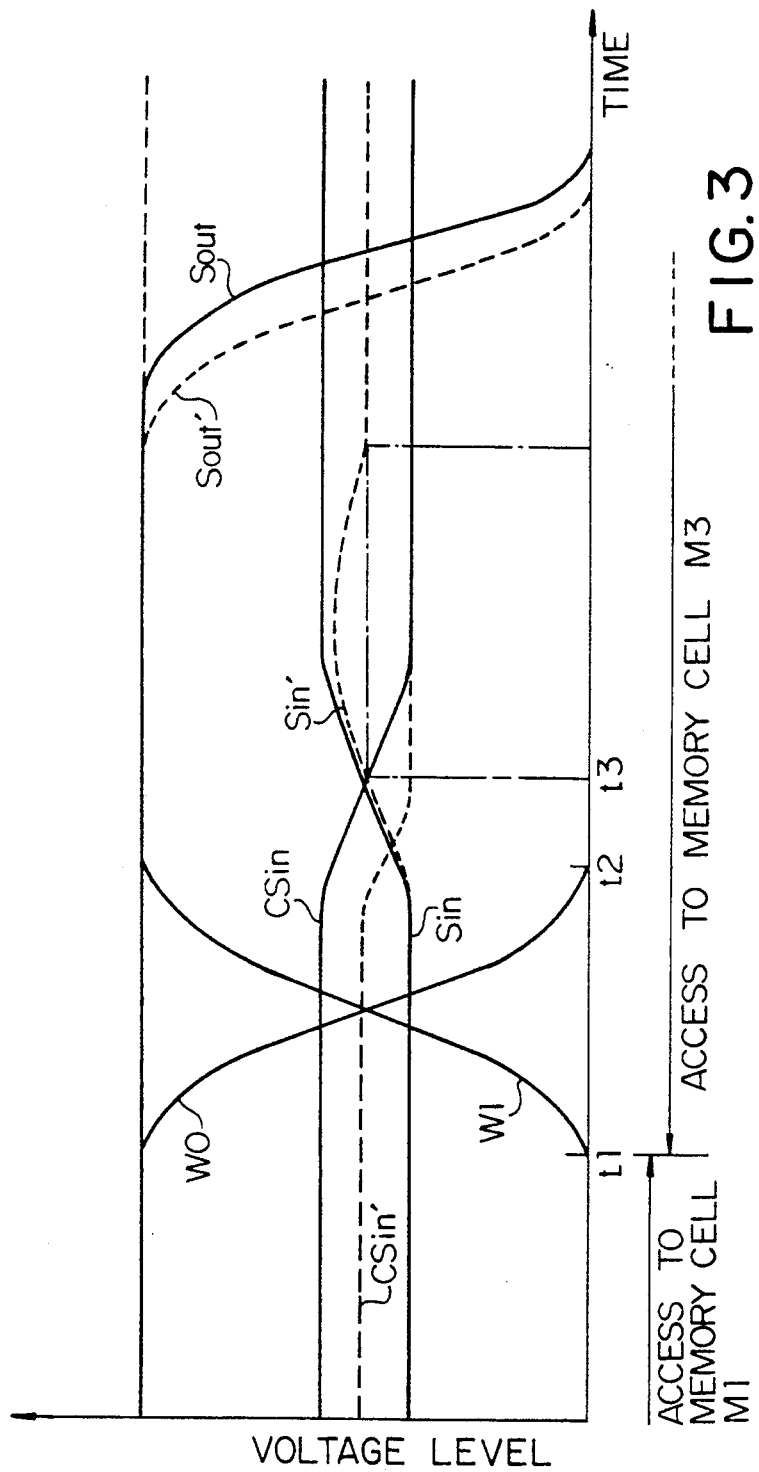
FIG. 3 is a diagram showing the waveforms of essential signals produced in the prior art semiconductor memory device as well as a semiconductor memory device equipped with a sense amplifier circuit according to the present invention.

The circuit behavior of the sense amplifier circuit 44 is similar to that of the sense amplifier circuit 4 except for variations of the voltage levels at the input nodes Sin and CSin as well as at the output node Sout. The voltage levels at the input nodes Sin and CSin are indicated by dash lines Sin' and CSin' in FIG. 3, and the waveform of the output data signal at the output node Sout is represented by dash lines Sout'.

The input node Sin is assumed to be coupled to a memory transistor shifted from the on-state to the off-state, and the voltage level at the input node Sin temporally exceeds a regular level at time t3 due to the time delay introduced by the inverter circuit IN11. However, the load means L1 discharges the current to the ground node, and the voltage level at the input node Sin decays, thereby reaching the regular level at time t4. When the voltage level at the input node Sin goes down below the regular level, the inverter circuit IN11 allows the second n-channel type field effect transistor QN11 to supplement current, and, for this reason, the voltage level at the input node Sin is maintained around the regular level. Since the regular level is lower than that of the prior art example, the sense amplification is speed up as will be understood from the dash lines Sout', and the semiconductor memory device equipped with the sense amplifier circuit 44 is improved in the data read-out operation.

Second Embodiment

Figure 5:
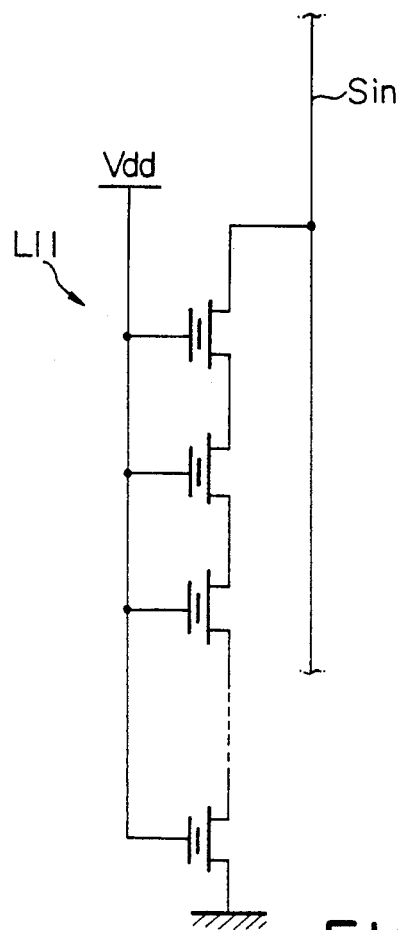
FIG. 5 is a circuit diagram showing the arrangement of a load circuit incorporated in another sense amplifier circuit according to the present invention.

Turning to FIG. 5 of the drawings, another load means L11 comprises more than four stages of load transistor, and the load transistors are of the FAMOS structure. Each of the load means L1 and L2 has only three stages, however, the amount of current consumed by the load means is adjustable by changing the number of stages in consideration of the time interval necessary for recovery to the regular level. Other component elements and the arrangement of the sense amplifier circuit are similar to that shown in FIG. 4, and no further description is incorporated for the sake of simplicity.

Third Embodiment

Figure 6:
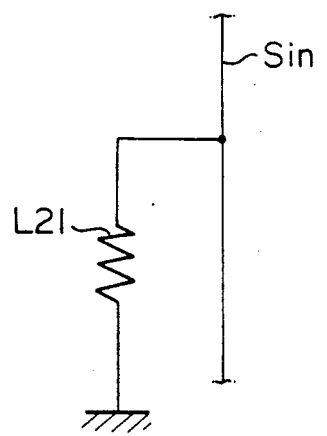
FIG. 6 shows another load circuit incorporated in still another sense amplifier circuit.

FIG. 6 shows still another lead means L21 incorporated in a sense amplifier circuit according to the present invention. The load means L21 is implemented by a resistive element such as an impurity region formed in a semiconductor substrate or a polysilicon strip. The load means L21 makes the circuit arrangement of the sense amplifier circuit simple.

Although particular embodiments of the present invention have been shown and described, it will be obvious to those skilled in the art that various changes and modifications may be made without departing from the spirit and scope of the present invention. For example, the memory transistors are of the floating gate avalanche metal oxide semiconductor device in the embodiments described above. However, the memory transistors may be of a mask program read only memory device, and the present invention is further applicable to another non-volatile semiconductor memory device and a volatile semiconductor memory device.

What is claimed is:

1. A sense amplifier circuit associated with at least one memory cell, comprising:
   a) a pair of input nodes respectively coupled to a signal line and a complementary signal line, said signal line and said complementary signal line being varied in voltage level in a complementary manner depending upon a bit of data information memorized in said memory cell;
   b) a series combination of a first transistor of one channel conductivity type and a second transistor of the opposite channel conductivity type coupled between a first source of voltage level and one of said input nodes;
   c) a first negative feedback loop coupled between said one of said input nodes and said second transistor;
   d) a series combination of a third transistor of said one channel conductivity type and a fourth transistor of said opposite channel conductivity type coupled between said first source of voltage level and the other input node;
   e) a second negative feedback loop coupled between the other input node and said fourth transistor;
   f) an output circuit coupled to said first and third transistors in a current-mirror fashion and producing an output data signal; and
   g) first and second load means respectively coupled between said input nodes and a second source of voltage level different in voltage level from said first source of voltage level, each of said first and second load means being smaller in conductance than said memory cell.

2. A sense amplifier circuit as set forth in claim 1, in which said memory cell has a memory transistor coupled between said signal line and said second source of voltage level for a true data bit and another memory transistor coupled between said complementary signal line and said second source of voltage level for a complementary data bit of said true data bit, and in which each of said first and second load means is implemented by a series combination of load transistors identical in transistor type with said memory transistors and coupled between said input node and said second source of voltage level.

3. A sense amplifier circuit as set forth in claim 2, in which said memory transistors and said load transistors are of a floating avalanche metal oxide semiconductor transistor.

4. A sense amplifier circuit as set forth in claim 3, in which said output circuit comprises f-1) a series combination of a fifth transistor of said one channel conductivity type, an output node and a sixth transistor of said opposite channel conductivity type coupled between said first and second sources of voltage level, a gate electrode of said fifth transistor being coupled to a gate electrode and a drain node of said first transistor, and f-2) a series combination of a seventh transistor of said one channel conductivity type and an eighth transistor of said opposite channel conductivity type coupled between said first and second sources of voltage level, a gate electrode of said seventh transistor being coupled to a gate electrode and a drain node of said third transistor, a gate electrode of said eighth transistor being coupled to a drain node thereof and a gate electrode of said sixth transistor.

5. A sense amplifier circuit as set forth in claim 4, in which each of said first and second feedback loops has an inverter circuit coupled between the associated input node and a gate of said second or fourth transistor.

6. A sense amplifier circuit as set forth in claim 1, in which said memory cell has a memory transistor coupled between said signal line and said second source of voltage level for a true data bit and another memory transistor coupled between said complementary signal line and said second source of voltage level for a complementary data bit of said true data bit, and in which each of said first and second load means is implemented by a resistive element.

* * * * *